United States Patent [19]

Yamazaki

[11] Patent Number: 4,908,678
[45] Date of Patent: Mar. 13, 1990

[54] FET WITH A SUPER LATTICE CHANNEL

[75] Inventor: Shunpei Yamazaki, Tokyo, Japan

[73] Assignee: Semiconductor Energy Laboratory Co., Ltd., Kanagawa, Japan

[21] Appl. No.: 102,841

[22] Filed: Sep. 30, 1987

[30] Foreign Application Priority Data

Oct. 8, 1986 [JP] Japan .................. 61-240544
Oct. 8, 1986 [JP] Japan .................. 61-240545
Oct. 8, 1986 [JP] Japan .................. 61-240546

[51] Int. Cl.⁴ ............................................ H01L 27/12
[52] U.S. Cl. ............................... 357/4; 357/23.7
[58] Field of Search ................. 357/4, 45 L, 23.7, 90

[56] References Cited

U.S. PATENT DOCUMENTS 4,194,935 3/1980 Dingle ..................... 357/4
4,642,144 2/1987 Tiedje ..................... 357/4

FOREIGN PATENT DOCUMENTS 0027681 2/1986 Japan ..................... 357/4

Primary Examiner—Martin H. Edlow
Attorney, Agent, or Firm—Sixbey, Friedman, Leedom & Ferguson

[57] ABSTRACT

An improved FET is disclosed. The transistor is characterized in that its channel is constituted in the form of a super lattice. The super lattice structure provides a number of square well potential areas through which carriers can pass with little interaction with the gate insulating film.

15 Claims, 3 Drawing Sheets

FET WITH A SUPER LATTICE CHANNEL

BACKGROUND OF THE INVENTION

This invention relates to a field effect transistor (FET) provided with a super lattice channel.

Insulated gate field effect transistors (IGFET) are semiconductor devices which are suitable for high-speed switching operation. Such a transistor comprises a source region, a gate region, a drain region, each region being formed within a single-crystalline silicon semiconductor, and an electrode arrangement therefor. The source and drain regions are fabricated by ion doping by which the threshold voltage can be controlled.

In such a conventional structure, carrier flow in on-state is limited to a very thin region contiguous to the gate insulated film, so that the movilities of the eletron and the hole are only about 300 $cm^2V/sec$ and 150 $cm^2V/sec$ due to interfacial scattering. Furthermore, in the way of seeking high density of integrated circuits, a short channel length is desired and therefore the concentration of carriers must be made high. Because of this, the mobilities again becomes low.

SUMMARY OF THE INVENTION

It is therefore an object of the invention to provide a gate insulated FET suitable for application to high speed switching.

It is another object of the invention to provide a gate insulating FET in which punch through breakdown is not likely.

In order to accomplish the above objects, according to the invention, a super lattice structure is formed below a gate insulating film as a channel region. In this structure, carriers pass through a plurality of wells (in the form of sequential square well potentials) so that the carriers are little affected from the interface between the channel region and the gate insulating film. Because of this, even though the channel is made from a substantially intrinsic semiconductor, the curvature of the energy band is comparative to that made of a conventional inpurity semiconductor.

DETAILED DESCRIPTION OF THE PREFERRED EMBODIMENTS

Figure 1A:
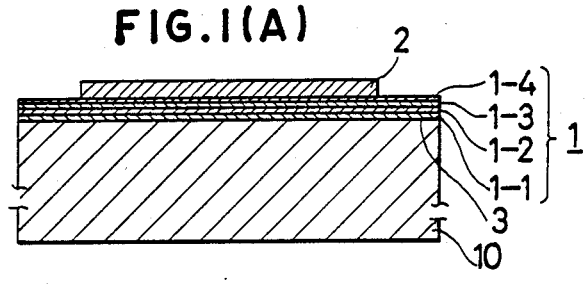
FIGS. 1(A) through 1(D) are cross section views showing the process of a gate insulating FET in accordance with the present invention.
Figure 1B:
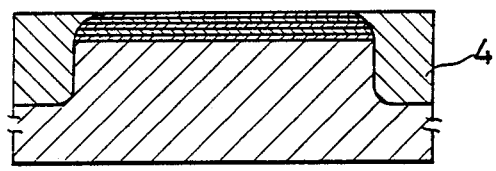
Figure 1C:
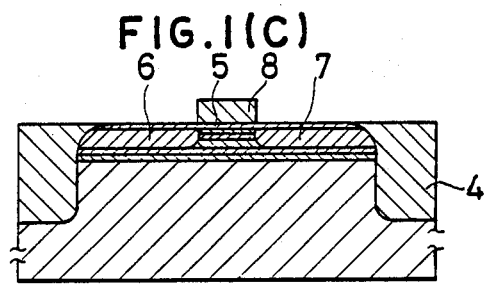

Referring to FIGS. 1(A) through 1(D), a gate insulated FET is explained according to its manufacturing method. On a single-crystalline silicon semiconductor substrate whose upper surface is sufficiently cleaned, 25 Å thick silicon semiconductor film and 25 Å thick silicon nitride ($Si_3N_{4-x}$ $0<x<1$) film are doposited in turn so that the two kinds of films are superimposed one on another for 2–50 times in a super lattice structure. The deposition is carried out with "hv-1", the trademark of a photo enhanced CVD apparatus distributed by Semiconductor Energy Laboratory Co., Ltd. Namely, disilan gas is introduced into a reaction chamber at 10 Torr and irradiated with ultraviolet light (185 nm in wavelength) emitted from a low pressure mercury lamp, whereupon a 25 Å thick silicon semiconductor film is deposited on the substrate which is heated to 200°–500° C., e.g., 400° C. Then, under the control of a microcomputor, a mixture gas, $NH_3/Si_2H_6=0.1-1.0$ (e.g., 0.3), is introduced into the reaction chamber and processed in the same manner so that a silicon nitride film is deposited with 25 Å in thickness. The thickness of the silicon nitride film may chosen between 10–100 Å (e.g., 25 Å). These deposition is carried out repeatedly and a super lattice structure is fabricated. Next, the super lattice 1 formed within the substrate 10 is annealed with a nitrogen laser beam in nitrogen atmospher. By this annealing, the semiconductor films 1-1, 1-3, . . . 1-n are crystallized into single crystalline layers in virtue of the single crystalline structure of the substrate 10. The silicon nitride film 1-2, 1-4, . . . 1-(n-1) are crystallized into single crystalline layers, distorted crystalline layers, or non-single-crystalline layers, depending on the proportion of nitrogen to silicon.

On the super lattice 1, a mask 2 is placed, and the lattice and the substrate 10 is partially removed by anisotoropic etching. An insulating materal 4 is deposited into the etched portions by an existing method which is used for forming a trench structure. After taking out the mask 2, a gate insulating film 5 and a gate electrode are formed. The gate insulating film is formed of silicon oxide by a photo enhanced CVD. The gate electrode is made of $WSi_2$, $TiSi_2$, or a semiconductor-metal multi-layer structure.

Then, a source region 6 and a drain region 7 are formed by ion inplantation. The inpurity densities of the source and drain regions are about $10^{17}-10^{19} cm^{-3}$. The interfaces of these region 6 and 7 adjacent to the super lattice 1 are desired normal to the principal surface. Over the source and drain regions 6 and 7 and the gate electrode 5, a silicon oxide layer is deposited on the substrate with 0.5 micron in thickness by a photo CVD using $SiH_4$ and $O_2$. The silicon oxide layer is anisotropically etched and removed by electron cyclotron resonance, except for the portion 9 on the peripheral side surface of the gate electrode 8.

Further, regions 6' and 7' for providing ohmic contacts and for making the sheet resistance of the source and the drain low are formed by a high density ion inplantation at $1\times10^{19}-2\times10^{20} cm^{-3}$, followed by thermal annealing. After covering the upper surface with an insulating layer 13, a source electrode 11 and a drain electrode 12 are formed in contact with the source contact region 6' and the drain contact region 7' through openings formed on the insulating layer 13. The electrodes 11 and 12 are formed of an aluminium layer by known method. The channel length of the FET thus formed is one micron.

The characteristics of a FET which had been manufactured by the above explained method with such doping levels that required for controlling the threshold voltage were measured. As results, no punch through was observed even when 5 V was applied betweem the source and the drain. The carrier mobility calculated in accordance with the C.T.Sah's fomula was 750 $cm^2V/sec$. This figure is 2.5 times as large as the conventional figure, 300 $cm^2V/sec$. The improved mobility is supposed to increase yet as the crystallinity of the super lattice is improved.

Figure 1D:
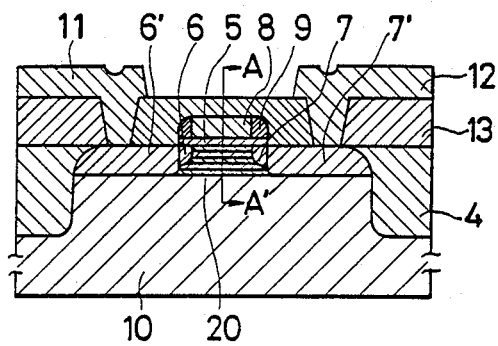
Figure 2A:
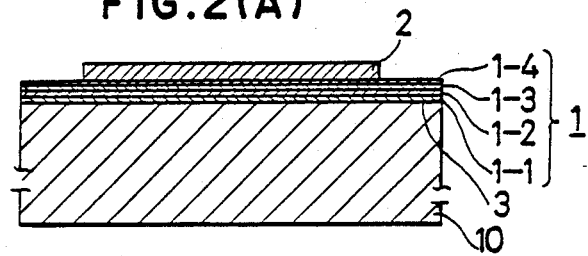
FIGS. 2(A) through 2(D) are cross section views showing the process of another embodimant of the present invention.
Figure 2B:
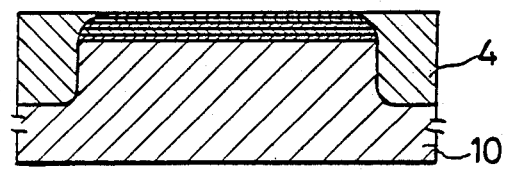
Figure 2C:
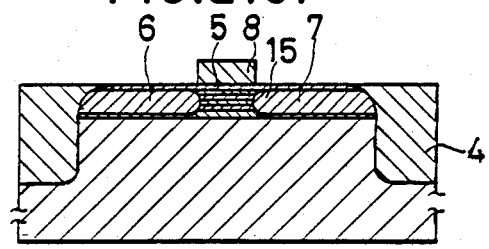
Figure 2D:
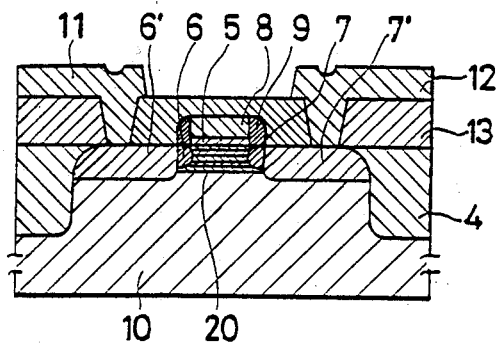
Figure 3A:
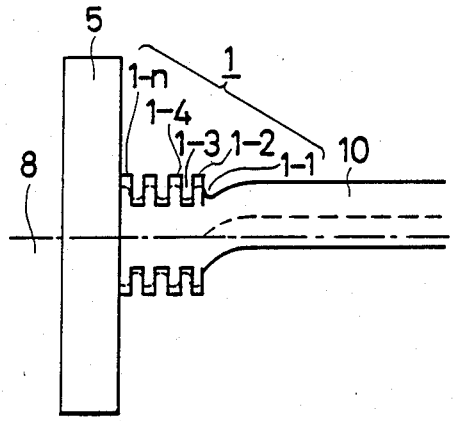
FIGS. 3(A) and 3(B) are energy band diagrams of a gate insulating FET in accordance with the present invention.
Figure 3B:
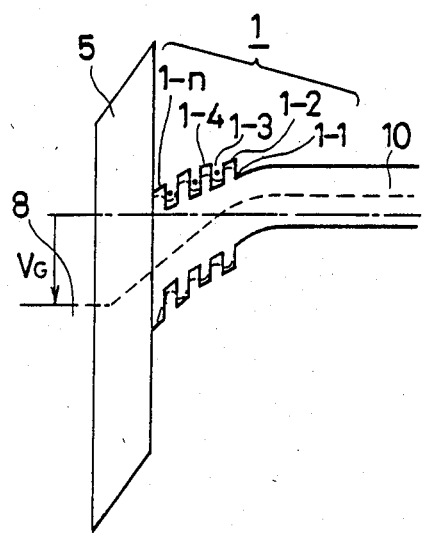

FIGS. 3(A) and 3(B) are energy diagrams taken across the A-A' line of FIG. 1(D) showing energy bands of the device formed in accordance with the above method. As seen from FIG. 3(A), there are a number of regions, apart from the gate insulating film 5, where carriers flock and can exist stably. Although the diagram is changed under a gate voltage $V_G$, the carrier passages remain apart form the gate insulating film as illustrated in FIG. 3(B). Namely, it is avoided that carriers are concentrated a very near region contiguous to the insulating film 5.

Referring to FIGS. 2(A) through 2(D), a second embodiment is illustrated. Of the Figures, FIGS. 2(A) and 2(B) and corresponding description are same as the preceding embodiment, so that no redundant explanation is repeated. In this embodiment, source and drain regions 6 and 7 are formed so that the inpurity density is higher at a deeper position. Because of this, the channel length between the source and the drain becomes longer as approaching to the gate insulating film 5. And the carrier can drift easily at an inner region as compared with a shallow region so that the influence of interfacial diffusion is reduced. The carrier mobility was improved to 850 cm$^2$V/sec. The other manufacturing conditions are same as in the preceding embodiment.

A thrid embodiment is directed to another forming method of such devices as illustrated in FIGS. 1(A) to 1(D) or in FIGS. 2(A) to 2(D). The super lattice 1 is fabricated by photo epitaxial growth. Namely, with the same apparatus used for the first embodiment, $Si_2H_6$ and $H_2SiF_2$ are introduced into the reaction chamber almost at a same rate. In addition, hydrogen gas is introduced at a rate 20 times as high as that of $Si_2H_6$. The substrate temperature is 500° C. The reaction pressure is 10 Torr. Other processes are same as those of the first embodiment. Photo CVD and photo epitaxial growth are excellent in forming thin films with 5–100 Å, e.g., 10–30 Å repeatedly without damaging underlying surfaces.

The invention should not limited to the above particular embodiments and many modifications and variations may cause to those skilled in the art. For example, in place of silicon nitride films, $SiO_{2-x}$ ($0 < x < 0$) or $Si_xC_{1-x}$ ($0 < x < 1$) can be used.

I claim:

1. An electronic device comprising:
   a substrate within which first and second impurity regions and a superlattice structure between said first and second impurity regions are formed where the superlattice structure has upper and lower surfaces extending between the first and second impurity regions; and
   wherein the impurity densities of said first and second impurity regions are greater at a lower level beneath the upper surface of the superlattice structure than at a said upper surface of the superlattice structure so that the length of the superlattice structure between the first and second impurity regions is less at said lower level than at said upper surface of the superlattice structure in order to define a low resistance inner channel within the superlattice structure between the first and second impurity regions.

2. The transistor of claim 1 further comprising a highly doped source contact region and a highly doped drain contact region in contact with said source region and said drain region respectively.

3. The transistor of claim 2 wherein said narrow-energy-gap film is made of silicon nitride.

4. The transistor of claim 2 wherein said wide-energy-gap film is made of silicon semiconductor.

5. An electronic device as in claim 1 where said lower level is intermediate the upper and lower surfaces of the superlattice structure.

6. An electronic device as in claim 1 where said substrate includes a bulk portion in contact with the lower surface of the superlattice structure and where said first and second impurity regions are separated from said bulk portion by at least said superlattice structure.

7. An electronic device as in claim 6 including ohmic contact regions disposed within said substrate in contact with said first and second impurity regions.

8. An electronic device as in claims 1, 9, or 6 where said first and second impurity regions are the source and drain of an insulated gate field effect transistor and said superlattice structure is the gate region extending between the source and drain.

9. An electronic device comprising
   a substrate within which first and second impurity regions and a superlattice structure between said first and second impurity regions are formed where the superlattice structure has upper and lower surfaces extending between the first and second impurity regions; and
   wherein said first and second impurity regions are respectively curved toward the opposite ends of the superlattice structure so that the length of the superlattice structure between the first and second impurity regions is less at a lower level beneath the upper surface of the superlattice structure than at said upper surface of the superlattice structure in order to define a lower resistance inner channel within the superlattice structure between the first and second impurity regions.

10. An electronic device as in claim 9 where said lower level is intermediate the upper and lower surfaces of the superlattice structure.

11. An electronic device as in claim 9 where said substrate includes a bulk portion in contact with the lower surface of the superlattice structure and where said first and second impurity regions are separated from said bulk portion by at least said superlattice structure.

12. An electronic device as in claim 11 including ohmic contact regions disposed within said substrate in contact with said first and second impurity regions.

13. An electronic device as in claims 9, 10, or 11 where said first and second impurity regions are the source and drain of an insulated gate field effect transistor and said superlattice structure is the gate region extending between the source and drain.

14. A gate insulated field effect transistor comprising:
    a substrate within which source and drain regions and a gate region between said source and drain regions are formed and where the gate region has an upper surface, the gate region consisting of a superlattice structure;
    wherein the channel length of said gate region between said source and drain regions is less at a lower level beneath the upper surface of the gate region than at said upper surface of the gate region in order to define a low resistance inner channel within the gate region between the source and drain regions.

15. The transistor of claim 14 where said superlattice structure comprises alternate wide-energy-gap films and narrow-energy-gap films.

* * * * *